(12) United States Patent
Kakinuma et al.

(10) Patent No.: US 6,581,132 B1
(45) Date of Patent: Jun. 17, 2003

(54) FLASH MEMORY SYSTEM INCLUDING A MEMORY MANAGER FOR MANAGING DATA

(75) Inventors: Yuji Kakinuma, Tokyo (JP); Hiroya Kitagawa, Tokyo (JP); Teruo Shimada, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/374,267

(22) Filed: Aug. 16, 1999

Related U.S. Application Data

(63) Continuation of application No. PCT/JP98/05545, filed on Dec. 8, 1998.

(30) Foreign Application Priority Data

Dec. 16, 1997 (JP) ............................................. 9-363504
Dec. 22, 1997 (JP) ............................................. 9-365704

(51) Int. Cl.[7] .............................................. G06F 12/08
(52) U.S. Cl. ....................... 711/103; 711/156; 711/206; 711/209
(58) Field of Search ................................ 711/103, 156, 711/203, 206, 209

(56) References Cited

U.S. PATENT DOCUMENTS

| | | | |
|---|---|---|---|
| 5,200,959 A | | 4/1993 | Gross et al. |
| 5,297,148 A | | 3/1994 | Harari et al. |
| 5,835,935 A | * | 11/1998 | Estakhri et al. .............. 711/103 |
| 5,943,692 A | * | 8/1999 | Marburg et al. ............. 711/203 |
| 5,963,983 A | | 10/1999 | Sakakura et al. |
| 5,987,563 A | * | 11/1999 | Itoh et al. ..................... 711/103 |
| 6,000,006 A | * | 12/1999 | Bruce et al. .................. 711/103 |
| 6,223,308 B1 | * | 4/2001 | Estakhri et al. ............... 714/42 |

FOREIGN PATENT DOCUMENTS

| | | |
|---|---|---|
| EP | 0 522 780 | 1/1993 |
| JP | 64-26220 | 1/1989 |
| JP | 64-81028 | 3/1989 |
| JP | 2-292798 | 12/1990 |
| JP | 5-73433 | 3/1993 |
| JP | 5-282880 | 10/1993 |
| JP | 6-250799 | 9/1994 |
| JP | 6-332806 | 12/1994 |
| JP | 7-36759 | 2/1995 |
| JP | 8-50564 | 2/1996 |
| JP | 2530102 | 6/1996 |
| JP | 8-203292 | 8/1996 |
| JP | 2582487 | 11/1996 |
| JP | 9-161491 | 6/1997 |
| JP | 9-282111 | 10/1997 |
| JP | 9-319666 | 12/1997 |

* cited by examiner

Primary Examiner—Gary Portka
(74) Attorney, Agent, or Firm—Oblon, Spivak, McClelland, Maier & Neustadt, P.C.

(57) ABSTRACT

A flash memory system of the present invention comprises a memory manager for managing data transmission/reception between a host computer and a flash memory, said memory manager having an address conversion table for converting a logical address given to the flash memory from the host computer and a physical address as an actual address of the flash memory, said address conversion table being defined in accordance with minimum erasing units of the flash memory. This can realize a flash memory system which has little delay in a writing/reading time, enables a high-speed operation, and can adequately manage defective sectors, defective bits, and the like.

22 Claims, 10 Drawing Sheets

FIG. 2

ADDRESS CONVERSION TABLE ~31

| 0000 | 0001 | 0002 | 0003 | 0004 | 0005 | 0006 | 0007 |
|------|------|------|------|------|------|------|------|
| #0000 | #0001 | #0002 | #0004 | #0005 | #0006 | #0007 | #0008 |
| 0008 | 0009 | 0010 | 0011 | 0012 | 0013 | 0014 | 0015 |
| #0009 | #0010 | #0011 | #0012 | #0013 | #0014 | #0015 | #0016 |
| 0016 | 0017 | 0018 | 0019 | 0020 | 0021 | 0022 | 0023 |
| #0017 | #0018 | #0019 | #0021 | #0022 | #0023 | #0024 | #0025 |
| 0024 | 0025 | 0026 | 0027 | 0028 | 0029 | 0030 | 0031 |
| #0026 | #0027 | #0028 | #0029 | #0030 | #0031 | #0032 | #0033 |
| 0032 | 0033 | 0034 | 0035 | 0036 | 0037 | 0038 | 0039 |
| #0034 | #0035 | #0036 | #0037 | #0038 | #0039 | #0040 | #0041 |

| Nh-7 | Nh-6 | Nh-5 | Nh-4 | Nh-3 | Nh-2 | Nh-1 | Nh |
|------|------|------|------|------|------|------|------|
| #Nh-5 | #Nh-4 | #Nh-3 | #Nh-2 | #Nh-1 | #Nh | #Nh+1 | #Nh+2 |

FIG. 5

BLOCK STATUS TABLE ~32

| #0000 FF | #0001 FF | #0002 FF | #0003 FF | #0004 FF | #0005 FF | #0006 FF | #0007 FF |
|---|---|---|---|---|---|---|---|
| #0008 FF | #0009 FF | #0010 FF | #0011 FF | #0012 FF | #0013 FF | #0014 FF | #0015 FF |
| #0016 FF | #0017 FF | #0018 FF | #0019 FF | #0020 FF | #0021 FF | #0022 FF | #0023 FF |
| #0024 FF | #0025 FF | #0026 FF | #0027 FF | #0028 FF | #0029 FF | #0030 FF | #0031 FF |
| #0032 FF | #0033 FF | #0034 FF | #0035 FF | #0036 FF | #0037 FF | #0038 FF | #0039 FF |
| #Nmax-7 FF | #Nmax-6 FF | #Nmax-5 FF | #Nmax-4 FF | #Nmax-3 FF | #Nmax-2 FF | #Nmax-1 FF | #Nmax FF |

FIG. 8

| 0000 | 0001 | 0002 | 0003 | 0004 | 0005 | 0006 | 0007 | / | 0008 |
|------|------|------|------|------|------|------|------|---|------|
| 0009 | 0010 | / | / | 0011 | 0012 | 0013 | / | 0014 | 0015 |
| 0016 | 0017 | 0018 | 0019 | 0020 | 0021 | 0022 | 0023 | 0024 | 0025 |
| 0026 | 0027 | 0028 | 0029 | 0030 | 0031 | / | 0032 | 0033 | / |
| 0034 | 0035 | 0036 | 0037 | / | 0038 | 0039 | 0040 | / | 0041 |

| 0498 | 0499 | 0500 | 0501 | 0502 | 0503 | 0504 | 0505 | 0506 | / |
| / | / | | | | | | | | |

| Nh-7 | Nh-6 | Nh-5 | Nh-4 | Nh-3 | Nh-2 | Nh-1 | / | / | Nh |

FIG. 11

| #0000 FF | #0001 FF | #0002 FF | #0003 0F | #0004 FF | #0005 FF |
|---|---|---|---|---|---|
| #0006 FF | #0007 FF | #0008 FF | #0009 FF | #0010 FF | #0012 FF |
| #0013 FF | #0014 FF | #0015 FF | #0016 FF | #0017 FF | #0018 FF |
| #0019 FF | | | | | |

FIG. 12

| | 51 | 52 |
|---|---|---|
| #0000 | | FF 00 |
| #0001 | | FF 01 |
| #0002 | | FF 02 |
| #0003 | ▨ | 0F -- |
| #0004 | | FF 03 |
| #0005 | | FF 04 |
| ... | | |
| #0500 | | FF Nh-1 |
| #0501 | | FF Nh-2 |
| #0502 | | |
| #0503 | | |

FLASH MEMORY SYSTEM INCLUDING A MEMORY MANAGER FOR MANAGING DATA

CROSS REFERENCE TO RELATED APPLICATIONS

This application claims benefit of priority to Japanese Patent Application No. P09-363504 filed Dec. 16, 1997, the entire disclosure of which is incorporated by reference herein.

This is a continuation of PCT/JP98/05545, filed Dec. 8, 1998.

FIELD OF INVENTION

The present invention relates to a flash memory which is a nonvolatile memory, more particularly to a flash memory system provided with a management system for appropriately managing a flash memory.

DISCUSSION OF THE BACKGROUND

As a storage medium for use in a computer system, a magnetic recording medium such as a hard disc or a floppy disc has been heretofore used. Above all, the hard disc having a large capacity and capable of operating at a high speed can store a large amount of data, and therefore it is positioned as a central storage medium of the system.

However, the manufacturing process of the hard disc is complicated, and it is difficult to realize its miniaturization, weight-saving and cost reduction. Since a structure is moved during the use of the hard disc, a relatively large consumption power is required, and particularly in the case that the hard disc is applied to a portable apparatus or the like, this problem tends to rise.

As the storage medium other than the hard disc, a flash memory is known as a nonvolatile storage element. In the flash memory, a power supply to maintain storage is unnecessary, but the flash memory, for structural reasons thereof, has a finite physical life of about $10^{10}$ in terms of a rewriting time. Therefore, in order to use the flash memory relatively safely and stably for a long period of time, an expired storage element and a section in which a defect occurs are detected, and these troubles need to be avoided to store data. Furthermore, in the case of the flash memory, new data cannot be written over a section in which data has already been stored. Therefore, when the new data is to be stored, a stored content must be once erased before the data is written. However, a unit which can be erased is not an individual storage element (=bit) unit, but it is a block unit such as 4 kilobytes or 8 kilobytes. Therefore, generally, after a data portion other than the data to be rewritten is once taken out of the block to be erased, the block is erased, and the data portion needs to be newly added/written again. In consequence, the write processing operation is very complex.

In Japanese Patent Application Laid-open No. 292798/1990, a flash EEPROM system is described for the purpose of enhancing a writing/reading speed to a flash memory and managing defective cells, and the like. In the flash EEPROM system described therein, an access time is intended to be enhanced using a cache memory. However, shortening of the access time dependent on the cache memory is naturally limited, and in order to further enhance the writing/reading speed to the flash memory, an operation speed of the entire flash memory system needs to be enhanced.

Moreover, in the above-described publication, for the management of the defective cells, and the like, a redundant portion is provided with ECC and another information, and the defective cells, and the like are managed only with the information of the redundant portion. However, since the defective cells, and the like are managed only with the redundant portion, the storage capacity of the redundant portion has to be enlarged, which compresses an area to store actual data. Furthermore, since the system manages the defective cells, and the like only with the redundant portion, before reading the actual data, the redundant data is read, and a propriety of data stored in the memory is judged, or recovering, or the like of the data is performed, which remarkably delays the access time.

SUMMARY OF THE INVENTION

An object of the present invention is to realize a flash memory system which has little delay in a writing/reading time, can relatively easily perform a writing operation, can operate at a high speed and which can adequately manage defective sectors, and the like.

The above-described object is attained by the following constitutions.

(1) A flash memory system comprising a memory manager for managing data transmission/reception between a host computer and a flash memory, said memory manager having an address conversion table for converting a logical address given to the flash memory from the host computer and a physical address as an actual address of the flash memory, said address conversion table being defined in accordance with minimum erasing units of the flash memory.

(2) The flash memory system according to the above (1) comprising said memory manager, a bus interface connectable to the host computer, and a flash memory interface for performing a writing/reading to the flash memory, said memory manager having data relay means for relaying data transmitted to a side of the flash memory from a side of the host computer and data transmitted to the side of the host computer from the side of the flash memory.

(3) The flash memory system according to the above (1) or (2) wherein:

said address conversion table functions so that a logical block address obtained by dividing, into said minimum erasing units, the logical address used when the host computer designates a minimum storage unit on a storage medium may correspond to a physical block address obtained by dividing said physical address into said minimum erasing units.

(4) The flash memory system according to any one of the above (1) to (3) wherein the conversion of said logical address and said physical address is performed before the writing/reading of data to the flash memory is started.

(5) The flash memory system according to any one of the above (1) to (4) wherein a size of a physical address area of said flash memory is larger than a size of a logical address area.

(6) The flash memory system according to any one of the above (1) to (5) wherein when a trouble occurs in an arbitrary minimum erasing unit corresponding to said logical address area, the minimum erasing unit is replaced with any one of the minimum erasing units of a portion of the physical address area which does not correspond to the logical address area.

(7) The flash memory system according to any one of the above (1) to (6) wherein:

said data relay means further has a block status table, this block status table has data indicating a state of said each physical block on the flash memory, and said data indicates at least whether or not the block is good, whether or not a bad sector is present and whether or not the block is used.

(8) The flash memory system according to any one of the above (1) to (7) wherein said address conversion table is formed on RAM by data read from a redundant portion of the flash memory after resetting.

(9) The flash memory system according to the above (7) or (8) wherein said block status table is formed on the RAM by the data read from the redundant portion of the flash memory after the resetting.

(10) A flash memory system comprising a memory manager for managing data transmission/reception between a host computer and a flash memory, said memory manager setting a size of an area of a logical address in which the flash memory is accessible from said host computer to be smaller than a size of an area of a physical address as an actual address of the flash memory, said memory manager having a queue ready for use in a surplus area of the physical address area which does not correspond to the logical address area.

(11) The flash memory system according to the above (10) wherein said memory manager treats said physical address area, said logical address area and said queue every block which is divided into a minimum erasing unit of the flash memory.

(12) The flash memory system according to the above (10) or (11) wherein an area of the flash memory corresponding to said queue is in an erased state.

(13) The flash memory system according to any one of the above (10) to (12) wherein when a trouble occurs in an arbitrary block in the physical address area, said memory manager replaces the block with an arbitrary block in said queue.

(14) The flash memory system according to any one of the above (10) to (13) wherein:

when data is written to the flash memory, said memory manager writes new data to a predetermined block in the queue, said memory manager sets this data as a logical block address of an estimated writing destination, and sets a block of the estimated writing destination as the queue.

(15) The flash memory system according to the above (14) wherein:

in a case where the estimated writing destination block has data other than data to be updated, after the transfer of a predetermined amount of data from the host computer is completed, said memory manager transfers the existing data from the estimated writing destination block to the predetermined block in the queue in which the new data is written.

(16) The flash memory system according to any one of the above (10) to (15) wherein:

said memory manager functions so that the physical address area and the logical address area may correspond to the logical block address and a physical block address divided into the minimum erasing unit, and said memory manager sets a start position of this correspondence relation as an arbitrary position determined every predetermined-times of resets.

(17) The flash memory system according to any one of the above (10) to (16) wherein:

said memory manager writes data of an arbitrary block in the physical address area corresponding to the logical address area to a block of the queue every predetermined times of resets, said memory manager sets an address of the block of the queue, in which the data is written, as the logical block address of the arbitrary block in the physical address area, and said memory manager sets the arbitrary block in said physical address area as the queue.

(18) The flash memory system according to any one of the above (10) to (17) comprising, in addition to said memory manager, a bus interface for connecting to the host computer and a flash memory interface for performing a reading/writing operation to the flash memory.

(19) The flash memory system according to any one of the above (10) to (18) wherein said queue is controlled by a pointer.

(20) The flash memory system according to any one of the above (1) to (19) wherein said minimum erasing unit corresponds to 8 or 16 minimum storage units.

(21) The flash memory system according to any one of the above (1) to (20) wherein said minimum storage unit has a size obtained by adding a data length of redundancy to a data length of one sector.

(22) The flash memory system according to any one of the above (1) to (21) wherein a redundant portion of said minimum storage unit has data indicating at least whether or not the block to which the minimum storage unit belongs is good, whether or not a bad sector is present and whether or not the block is used.

(23) The flash memory system according to any one of the above (1) to (22) wherein in said redundant portion, the same data is stored in one block.

(24) The flash memory system according to any one of the above (1) to (23) wherein said data relay means has two buffers for temporarily storing a predetermined length of data, and said data relay means alternately stores data transmitted from the side of the host computer or from the side of the flash memory in the two buffers, and alternately transmits data from the buffer filled with the data to the side of the flash memory or to the side of the host computer.

(25) The flash memory system according to any one of the above (1) to (24) which is an IC chip.

(26) The flash memory system according to any one of the above (1) to (25) which is a card-shaped external storage system.

BRIEF DESCRIPTION OF THE DRAWINGS

FIG. 2 is a schematic view showing one constitution example of an address conversion table.

FIG. 5 is a schematic view showing a constitution example of a block status table.

FIG. 8 is a schematic view showing that surplus areas are dispersed and arranged in the physical address area.

FIG. 11 is a schematic view of an operation during resetting, and shows that the block status table is formed.

FIG. 12 is a schematic view of the operation during resetting, and shows that the flash memory is tentatively numbered.

DETAILED DESCRIPTION OF THE PREFERRED EMBODIMENTS

Figure 1:
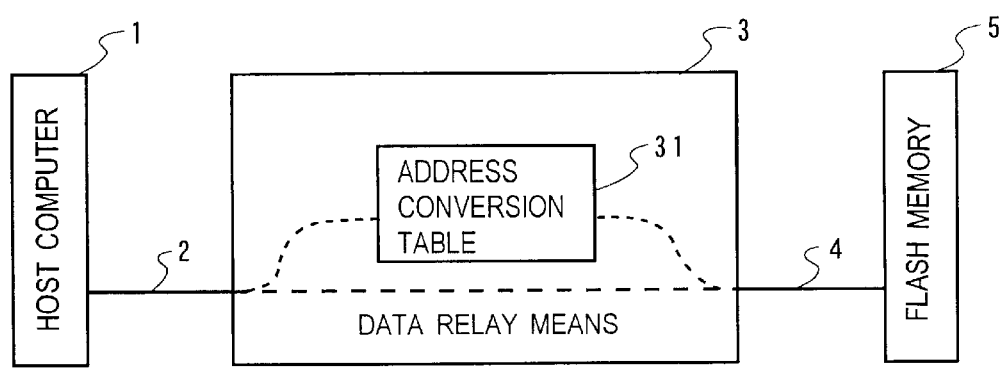
FIG. 1 is a block diagram showing a basic constitution of a flash memory system of the present invention.

A flash memory system of the present invention, for example, as shown in FIG. 1, comprises a memory manager 3 comprising a bus interface 2 which can be connected to a host computer 1, a flash memory interface 4 for performing writing/reading on the flash memory 5 and data relay means which relays data transmitted to a side of the flash memory from a side of the host computer and data transmitted to the side of the host computer from the side of the flash memory. The memory manager 3 has an address conversion table for converting a logical address given to the flash memory 5 from the host computer 1 and a physical address as an actual address of the flash memory 5, and the address conversion table is defined corresponding to a minimum erasing unit of the flash memory 5.

The memory manager 3 manages data transmission/reception of the host computer 1 and the flash memory 5. Specifically, transfer speeds of the data transmitted from the host computer 1 and the data transmitted from the flash memory 5 are adjusted, and logical address data for the reading/writing designated by the host computer 1 is converted to physical address data.

The address conversion table 31 correlates the logical address designated on the side of the host computer 1 and the physical address present on the side of the flash memory 5. By correlating the logical address and the physical address via the address conversion table 31, defective sections, and the like generated in the flash memory can be avoided to correlate both addresses. Additionally, without reading defective sectors, defective bits or other data from the flash memory, an adequate correlation is established beforehand, and referred to while having access to the memory to instantly calculate a necessary physical address, so that the flash memory is accessible at a high speed.

The address conversion table 31 is provided in the memory manager 3. Moreover, usually, the table is formed on a storage medium which can be referred to from a controller or the like of the memory manager 3. Then, the memory manager 3 uses the address conversion table 31 to convert the logical address given to the flash memory 5 from the host computer 1 to the physical address as the actual address of the flash memory 5, or to perform a reverse conversion.

The host computer 1 is provided with a microprocessor, peripheral elements of the microprocessor, a keyboard, a communication port, an expansion bus, a display, and another input/output means, and a mode and configuration thereof are not limited as long as the host computer can be connected to a hard disc, and another storage medium, and can perform necessary operations (regardless of general and specific applications) as a computer (personal computer).

Examples of the bus interface 2 include a bus for connecting to the host computer 1, such as SCSI, IDE and another external connection bus, PCMCIA and another PC card interface in conformity with these buses, and the like. Above all, as a preferable mode, when the flash memory system of the present invention is applied to PC card, PC card interface is used. Therefore, the bus interface 2 can appropriately be connected to the host computer in conformity with standards and specifications. Moreover, when the bus interface 2 is seen from the side of the host computer 1, the existing OS, an application software, or the like can be used as it is, as long as the flash memory 5 can be treated equally to the hard disc.

The flash memory 5 is a nonvolatile memory, and can be regarded as one type of EEPROM. Specifically, the data can be read at any time, but the data can be written usually only once after the data is erased, and the data cannot be overwritten. Therefore, before the data writing operation is performed, an operation for erasing the stored data is surely accompanied (excluding an initial state). When the data is erased, in the flash memory, for structural reasons thereof a predetermined storage area is collectively erased. In a NAND type flash memory for preferable use in the present invention, a minimum erasable area comprises usually 8 or 16 minimum storage units (one sector+redundant portion), i.e., 4 kbytes or 8 kbytes (excluding the redundant portion).

To secure a predetermined storage capacity, the lash memory 5 usually constitutes a memory array in which a plurality of flash memory ICs are assembled. Moreover, the flash memory interface 4 connected to the flash memory 5 for performing a writing/reading operation on the memory, such as a flash memory sequencer, and the like, a control element for automatically controlling and optimizing the writing/reading of the flash memory, and the like are connected.

Figure 3:
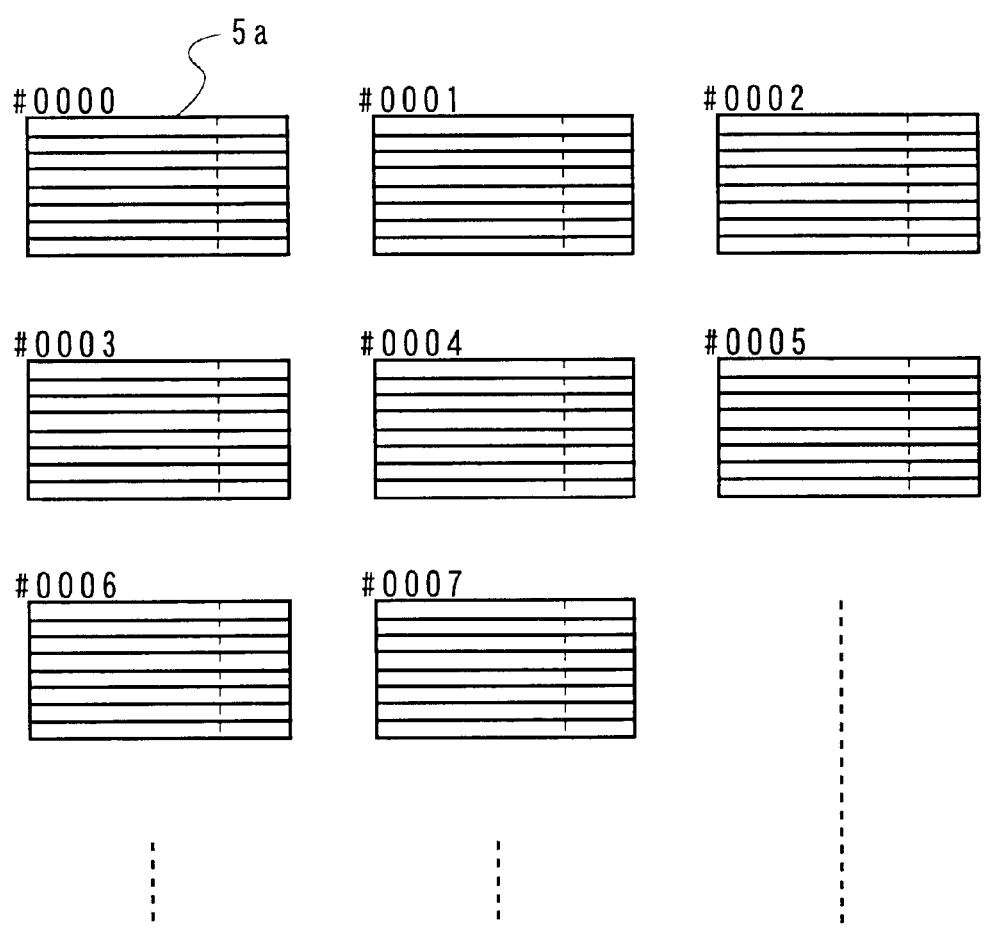
FIG. 3 is a schematic view showing a block constitution in a flash memory.

A concrete constitution example of the address conversion table 31, will next be described. FIG. 2 is a schematic view showing the constitution example of the address conversion table 31. The address conversion table 31 is formed corresponding to minimum erasing units (minimum erasing blocks) 5a in the flash memory 5 as shown in FIG. 3. Additionally, FIG. 3 schematically shows a block constitution of the flash memory 5, and in the drawing a numeric value with # attached thereto described above the block indicates a physical block address which is defined for each minimum erasing unit.

The minimum erasing unit is a storage area which is erased once in the flash memory 5. In the flash memory 5, as described above, the minimum storage unit is different from the minimum erasing unit, and each predetermined size of storage area is erased. The once erased area is called the minimum erasing unit, and an erasing operation of the flash memory has to be performed for each minimum erasing unit as a block in which a plurality of minimum storage areas are assembled. Additionally, in the minimum erasing unit 5a a portion surrounded by a solid line is a minimum storage unit, in which a smaller area partitioned by a broken line indicates a redundant portion.

In this manner, since the flash memory 5 which needs to be erased by each minimum erasing unit 5a is treated and managed by each minimum erasing unit 5a, the writing operation (reading operation) can efficiently be performed. Therefore, the address conversion table 31 is formed corresponding to the minimum storage unit.

For the address conversion table 31, in the example shown in FIG. 2, the logical block address is disposed in an upper part of one block, the physical block address (shown with # attached to a top of a numeral in the drawing) is disposed in a lower part, and a certain specific logical block address can usually have a one-to-one correspondence with an arbitrary physical block address. Specifically, the corresponding logical block address and physical block address are disposed in a predetermined block. Additionally, a maximum logical block address Nh in an accessible memory area opened on the side of the host computer 1, and a physical block address with a corresponding size are defined.

Here, the logical block address is an address number designated when the host computer 1 has access to a storage unit in a specific memory, and refers to a top address obtained by dividing the address into blocks each having a size corresponding to the minimum erasing unit 5a. The physical block address is an actual address number on the flash memory, and refers to a top address of the minimum erasing unit 5a.

The correspondence of both the logical block address and the physical block address in the address conversion table has the following meaning. Since the logical block address and the physical block address usually have one-to-one correspondence, in some cases the logical block address can be used as the physical block address as it is. However, in another case a deviation (or an offset) occurs between the logical block address and the physical block address. This is caused by a difference of both management systems, or by a defective block which cannot be used because of occurrence of a trouble, or this is a processing performed to prevent accesses from being concentrated in a specific memory area, or the like.

Above all, when the defective block is generated, the logical block address is excluded, and another logical block address needs to be allocated. FIG. 2 shows that the logical blocks are allocated in this manner. In the example, as a result of removal of physical block addresses #0003, #0020 as the defective blocks, #0004 is allocated to 0003, #0021 is allocated to 0019, and in the maximum value Nh in the logical block address, two blocks, i.e., #Nh+2 of physical block addresses are excessively required. Additionally, in the example, the physical block addresses are serially allocated to the logical block addresses, but may be allocated to arbitrary logical block addresses.

As described above, there are some cases where a deviation occurs between a storage area which can be designated by the logical block address, i.e., a logical address area and a physical address area which is an actual memory area as well as a maximum area of the physical address, and the physical address area is preferably set larger than the logical address area. Specifically, as the trouble arise in the physical address area can be compensated for by the storage area in the relevant physical address area, the logical address area is set the smaller. In other words, in the physical address area there is a surplus area which is not included in the logical address area.

A method of performing address conversion using the address conversion table will next be described.

It is now supposed that address data (hereinafter referred to as the logical address) for reading is transmitted from the host computer 1. Here, when the logical address is LBAs, the logical block address LBA can be represented as follows:

$$LBAs/k = LBA \ldots m \quad (I)$$

Here, k denotes the number of sectors which are present in one block, and is usually 8 or 16. Moreover, m denotes a remainder when division is performed by k. Specifically, this is an offset value which indicates a sector position in the logical block address.

The logical block address LBA obtained by the above equation is converted to the physical block address PBA by referring to a relevant section of the address conversion table. When the offset value m is added to the converted physical block address PBA, the physical address PA as the actual address on the flash memory is obtained.

After the controller of the memory manager 3 designates the physical address PA obtained as described above to set in such a manner that a predetermined reading operation is performed, a data reading/transfer mechanism in the data relay means 3 automatically reads and transfers the data. After performing the above-described setting, during the data transfer the controller can calculate an address to be read next. Therefore, an apparent time for the address conversion is hardly necessary. In this manner, since the address conversion is performed before the writing/reading operation is started, a high-speed operation is realized.

A preferable mode as the data relay means provided in the memory manager 3 will next be described.

The memory manager 3 transmits the data transmitted from the side of the host computer 1 via the bus interface 2 to the side of the flash memory 5 via the flash memory interface 4, and also has a reverse function of transmitting the data transmitted from the side of the flash memory 5 via the internal bus to the side of the host computer 1 via the bus interface 2.

Figure 4:
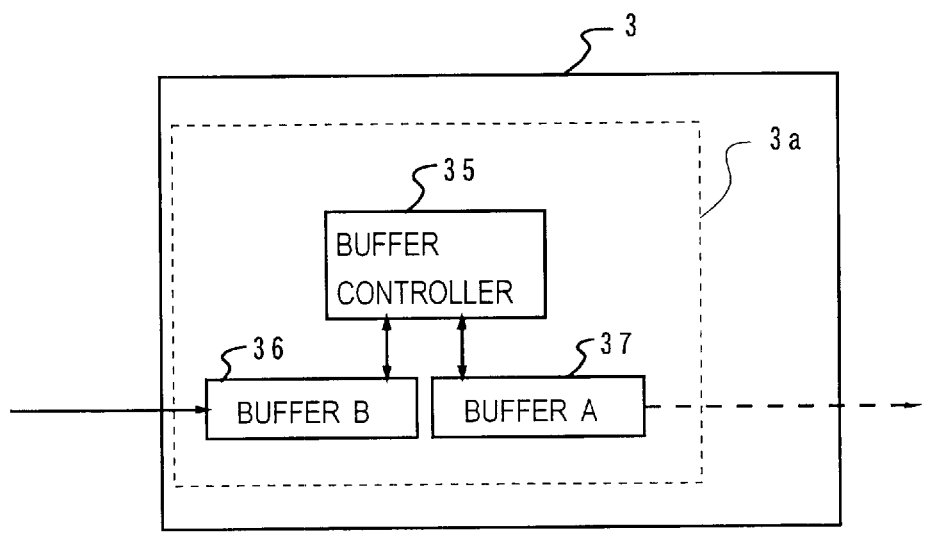
FIG. 4 is a block diagram showing a constitution example of data relay means preferably provided in a memory manager.

In this case, the data transmission/reception speed and timing on the side of the host computer 1 often differ from the data transmission/reception speed and timing on the side of the flash memory 5. Therefore, data relay means 3a as shown in FIG. 4 may preferably be provided.

Specifically, there are provided two buffers 36, 37 in which a predetermined size of data are stored. In this case, when one buffer A (B) is set as a data writing side (solid line side), the other buffer B (A) is set as a data reading side (broken line side). Subsequently, when the buffer controller 35 detects that one buffer A (B) on the data writing side is filled with a predetermined length of data and that data of the other buffer B (A) on the data reading side has already been read, the controller exchanges both buffers, sets one buffer A (B) filled with the data as the data reading side, and sets the other buffer B (A) from which the data has already been read as the data writing side.

As described above, by alternately writing data into two buffers and alternately reading data from the buffer filled with data, even if the data transmission/reception speed on the side of the host computer differs from that on the side of the flash memory, the data can be transferred in accordance with the speeds and timings. In this case, since the side fast in the data transmission/reception speed is surely placed in a standby state, the entire data transmission/reception speed is governed by the side slow in the data transmission/reception speed. Additionally, after the data in the buffer is read, it becomes empty like FIFO memory, but if a state in which it is filled with new data can be detected, overwriting may be performed.

The data length writable/readable to two buffers is not particularly limited, but is preferably one sector of data or 512 bytes, or a length to which redundant data is added.

As described above, since two buffers 36, 37 are alternately exchanged and allowed to transfer the data, data can be written to one buffer, and data can be read from the other buffer, so that a time required for relaying the data can considerably be shortened. In this case, since the buffers 36, 37 are momentarily exchanged by the buffer controller 35, as described above, the data transfer time can be considered to be equal to a slower speed of the host computer side or the flash memory side. Moreover, the buffer controller 35 is preferably constituted of hardware as a combination of gate circuits. The constitution only of the hardware rapidly enhances the operation speed.

The flash memory system of the present invention may comprise a block status table 32 which has data indicating the state of each physical block on the flash memory and indicating at least whether or not the block is good, whether or not a bad sector is present and whether or not the block is used. Since the block status table 32 is provided, the state of each physical block can quickly be grasped on the table, the queue described later can quickly be formed, and an appropriate memory management can be performed prior to or regardless of memory reading or writing.

The block status table 32 is constituted, for example, as shown in FIG. 5. In an example shown in the drawing, the physical block address (shown with # attached to a top of a numeral in the drawing) is disposed in an upper part of one block, a status value is disposed in a lower part, and each physical block address is provided with the corresponding status value. Then, the corresponding status value is defined up to a maximum physical block address #Nmax in an accessible memory area in the flash memory 5.

The status value is a value indicative of a state of the physical block address, for example, FF is written as an initial state (or an erased state), and subsequently, the value changes in accordance with the state of the block address. The data which can be represented by the status value is at least whether or not the block is good, whether or not the bad sector is present and whether or not the block is used. Moreover, in addition, a degree to which the block is good or bad, data about security or another data can be represented. A data indicating mode is not particularly limited, a specific data length, e.g., one byte code may be indicated, or each bit of the specific data length provided with a weight may be indicated.

Since the block status table 32 is provided, the state of each logical block can quickly be grasped. Therefore, when the address conversion table 31 is constructed, by referring to the block status table, the queue element described later, and the like can be removed to allocate the logical block address to the physical block address, and the block having the bad sector, the defective block or another block can quickly be detected to construct the address conversion table from which such block is removed. Moreover, an unused block can also be grasped easily from the block status table 32, and exchanging with the defective block or another operation can extremely easily and quickly be performed. Specifically, without having access to the flash memory, the state of each sector or block can be grasped, and a processing speed is remarkably enhanced.

Figure 6:
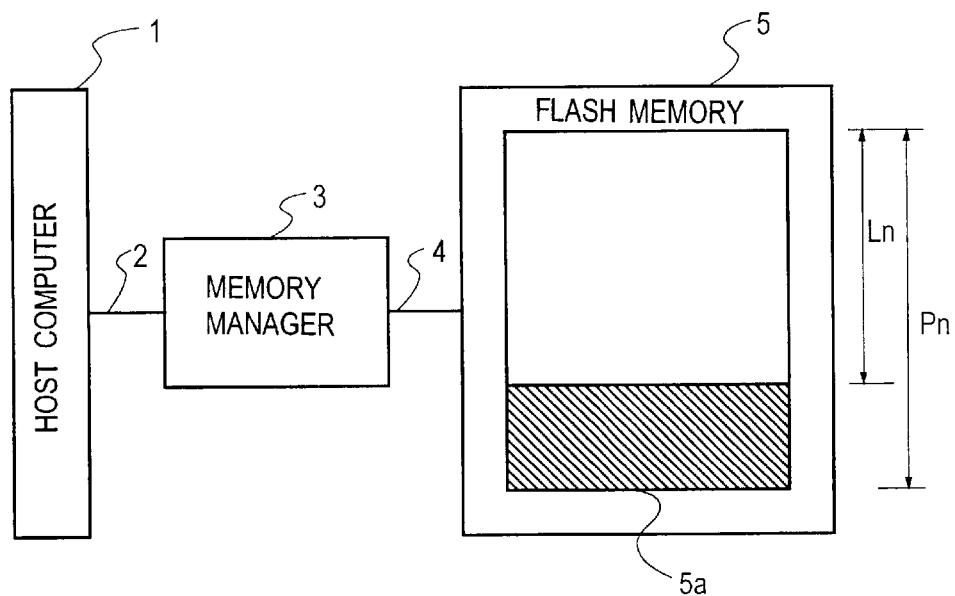
FIG. 6 is a block diagram showing the basic constitution of the flash memory system of the present invention, and shows that a surplus area is provided in the flash memory.

For example, as shown in FIG. 6, the memory manager 3 sets a logical address area Ln by which the flash memory 5 is accessible from the host computer 1 smaller than a physical address area Pn as the actual address of the flash memory, and has the queue ready for use in a surplus area 5a of the physical address area Pn not corresponding to the logical address area Ln.

Since the size of the physical address area as the actual address of the flash memory is set larger than the size of the logical address area by which the flash memory is accessed from the host computer, and the surplus area of the physical address area not corresponding to the logical address area is provided with the queue, for example, a defective section in the physical address area corresponding to the logical address area can be exchanged for a queue portion. Moreover, during writing to the flash memory, new writing data is once written in the queue portion, the existing data is supplemented from a portion to be written if necessary, and the queue portion is exchanged for the portion to be written, so that the operation during writing can extremely efficiently be performed.

Moreover, instead of merely arbitrarily using the surplus area, by managing the surplus area as the queue, an appropriate memory management can be performed without concentrating accesses to a specific memory area, or performing a complicated control.

In FIG. 6, the memory manager 3 sets the size Ln of the logical address area by which the flash memory is accessible from the host computer 1 smaller than the size Pn of the physical address area as the actual address of the flash memory, and has the queue ready for use in the surplus area of the physical address area not corresponding to the logical address area.

Specifically, the entire storage area or physical address area in the flash memory 5 is set larger than the logical address area accessible from the side of the host computer 1. In other words, the logical address area opened to the side of the host computer is smaller than the entire storage area or physical address area of the flash memory 5 by a predetermined area which includes the queue.

Usually in the initial state, the queue is serially formed from a small address in the surplus area (excluding defective sections, and the like). Moreover, the queue, the physical address and the logical address are preferably treated by each minimum erasing unit (block) of the flash memory 5. The minimum erasing unit is a minimum unit which is erased once on the flash memory 5. As described above, the flash memory is erased not by each minimum storage unit, but by each storage area of a certain size in which these units are assembled. Therefore, by treating the queue, the physical address and the logical address by each minimum unit of the erased area or minimum storage unit, an efficient memory control system can be obtained.

When a defective section is generated in the physical address area corresponding to the logical address area, the section is replaced with the queue. Since this operation is also performed for each block, it can efficiently and appropriately be managed. The writing operation of the flash memory 5 requires an erasing operation of each block, but by managing the flash memory 5 by each block, the operation can efficiently be performed.

The physical address usually has a one-to-one correspondence with the logical address. The correspondence is preferably defined for each block. Specifically, both addresses are treated by each block, and a top address is defined as the physical block address and the logical block address. Then, as offset values, the individual storage units, i.e., the physical address and the logical address are defined. Moreover, each block is converted, using the address conversion table, or the like, to the physical block address from the logical block address, or to the logical block address from the physical block address.

As described above, in all physical address areas, queues are present in areas other than the physical address areas corresponding to the logical address areas, but all the areas do not have to be the queues. In the surplus area there is sometimes a block which is permanently discarded as the defective block and which is not used even as the queue. Moreover, the surplus area is preferably in the range of 1 to 5% of the entire physical address area, more preferably about 2 to 3%.

Figure 7:
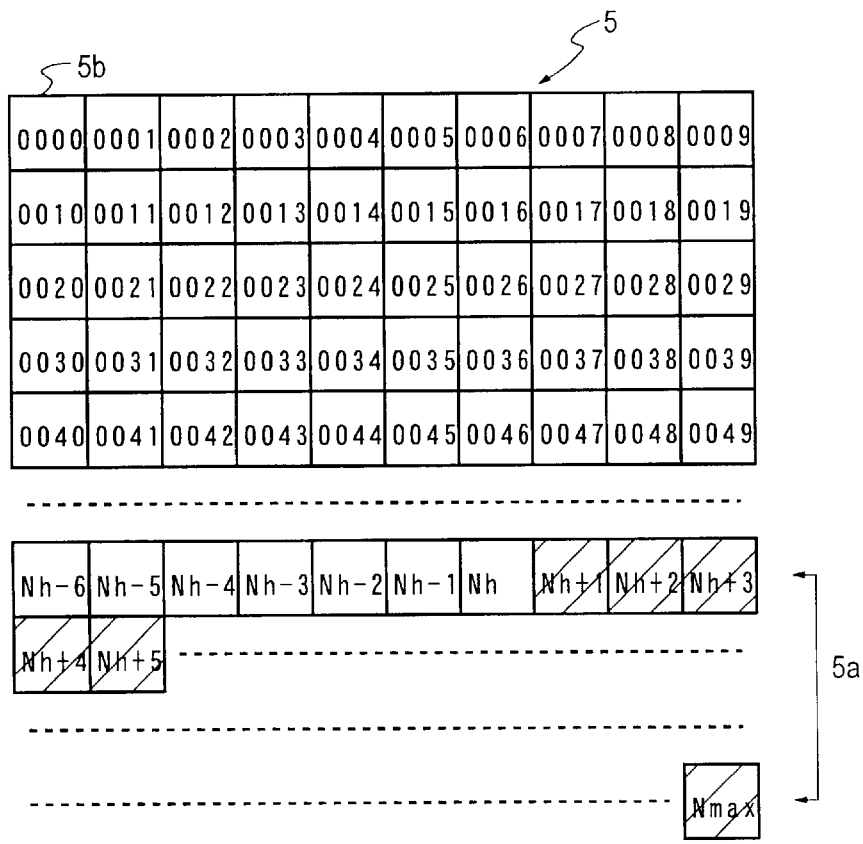
FIG. 7 is a schematic view in which logical addresses are arranged for a physical address area in the flash memory, and shows the physical address area corresponding to a logical address area.

A more concrete constitution of the queue will next be described. FIG. 7 is a block diagram schematically showing a memory space in the flash memory 5. In the drawing numerals and codes described in blocks denote the physical block addresses.

In the flash memory 5 of the example shown in the drawing, the physical block area opened on the side of the host computer 1 corresponds to the logical block address, and ranges to the maximum value Nh. Moreover, the surplus area 5a (shown by slashes in the drawing) exists to a maximum value Nmax of the physical block address from an address Nh+1 in which one is added to the physical block address corresponding to the maximum value Nh of the logical block address. Then, the queue is provided in the area.

The queue is usually selected from the areas which are defined as the surplus areas during the initial setting as described above. Therefore, each element of the queue is in the erased state (initial state), and in operation, writing can be performed on the queue as it is. Moreover, a new queue is added after the queue is erased, or after it is confirmed that the queue is in the erased state.

Additionally, the surplus area 5a (queue) does not have to continuously exist in the last part of the physical address area as shown in FIG. 7, and for example, as shown in FIG. 8, the area may be scattered like islands in the physical address area (portions shown by slashes in the drawing). As a result of the scattering of the surplus areas, in the example shown in the drawing, the maximum value Nh of the logical address area is in the same position as the maximum value Nmax of the physical address area. The scattered state of the surplus areas (queues) is formed by repeating an operation for replacing with the defective blocks described later and the queues during the writing operation. Additionally, in FIG. 8, numerals described in blocks indicate logical block addresses, different from FIG. 7. As described above, since the surplus area 5a having the queue does not correspond to the logical block address, it is not recognized from the side of the host computer 1.

Figure 9:
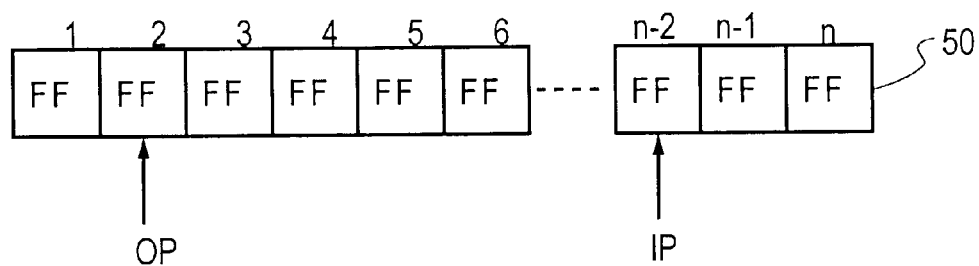
FIG. 9 is a view schematically showing a state of a queue.

A queue 50 is preferably controlled by a pointer. For example, as shown in FIG. 9, the pointer is controlled in such a manner that the number of blocks (hereinafter referred to as elements) constituting the queue 50 falls in a predetermined range. Specifically, in the example shown in the drawing, a sequence of the element or block is attached above the block, and in predetermined positions in the sequence, a taking-out point OP (2 in the example of the drawing) and a taking-in point IP (n-2) are present. In this case, every time the queue 50 is taken out, or put in, the pointer moves. Specifically, the following results:

(Position of Taking-In Point *IP*)−(Position of Taking-Out Point *OP*)=the Number of Elements Moreover, the queue itself may be registered in a management table or the like for management.

The flash memory system of the present invention preferably has an address conversion table for mutually converting the logical block address and the physical block address.

In the address conversion table 31 shown in FIG. 2, relative to the physical address area which is as the actual memory area as well as the maximum area of the physical address, the logical address area accessible from the host computer is set smaller. Specifically, the area is set small in such a manner that the queue can be set. In the address conversion table, the physical block address not corresponding to the logical block address can become an element of the queue.

The address conversion table 31 correlates the logical block address and the physical block address, but the correspondence of both addresses does not have to be in order from a small address number, and arbitrary addresses may correspond to each other. Specifically, both block addresses forming the predetermined area may only have a one-to-one correspondence. Therefore, instead of using the address conversion table, a function, or the like may be used.

When the logical block address is again associated with the physical block address by an resetting operation of the flash memory system, or the like, the address is usually associated serially from a small address number. In this case, relative to a smallest address number of the logical block address, a physical block address number with which the associating is started may arbitrarily be selected to change a start position. In this manner, the specific logical block address number and the corresponding physical block address number are varied without being fixed. For example, even if accesses are concentrated onto the small address number, or there is a frequently accessed area in a certain application software, the corresponding actual address of the flash memory changes, so that actually accessed sections can be dispersed.

A method of designating the arbitrary start position is not particularly limited, but a random number obtained by a known random number generating method, a function or another mathematical technique, or the like may be used to select an arbitrary block address.

Moreover, by the resetting operation of the flash memory system, or the like, out of the physical block addresses corresponding to the logical block addresses, an arbitrary block address may be exchanged for the queue block. By performing such exchanging, in the same manner as described above, the concentration of accesses onto the specific memory area can be prevented, and the access frequencies of the entire flash memory can be averaged.

For the frequency of the exchanging of the memory blocks, the exchanging may be performed every time the resetting, or the like is performed, and if the resetting is performed very frequently, by counting predetermined times, or using random numbers, and the like, the exchanging may be performed every predetermined times (frequencies).

The flash memory system of the present invention is used together with the flash memory, but as a device integral with the above-described constitution, the system can be provided independently of the flash memory. For example, the bus interface 2, the flash memory interface 4, and the memory manager 3 comprising the address conversion table and the data relay means may be integrated to form an IC (integrated circuit) chip. When the IC chip is combined with the flash memory, a small-size memory system can easily be obtained. Moreover, when the flash memory system of the present invention is combined with the flash memory, this combination is disposed in a card-shaped housing of predetermined standards, and PC card bus is used in the bus interface, a nonvolatile memory requiring no power supply can easily be obtained.

Embodiment

An embodiment will next be described to further detail the present invention.

[Initial Setting During Manufacture]

In an initial state after manufacture, the controller of the memory manager 3 evaluates each sector in the flash memory 5 (writing/reading can normally be performed, written data content has nothing unusual, and the like), and this evaluation is used as an evaluation content of a block unit to prepare the block status table 32.

Figure 10:
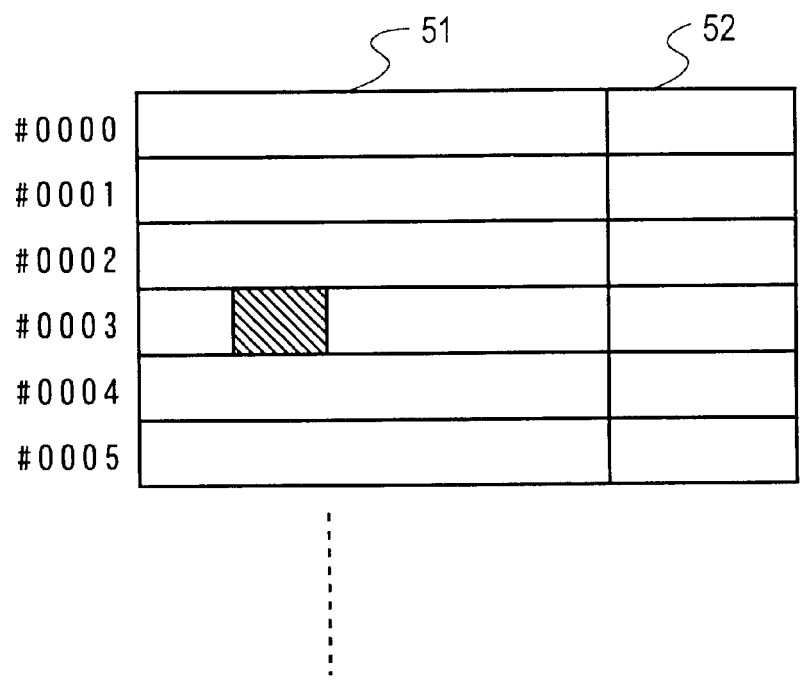
FIG. 10 is a schematic view showing states of an actual data storage area and a redundant data storage area in the flash memory.

For example, as shown in FIG. 10, in the flash memory comprising a predetermined size of actual data storage section 51 and a redundant data storage section 52, it is supposed that there is an abnormality in a physical block address #0003. The controller, for example, as shown in FIG. 11, evaluates physical block addresses in order. In a predetermined position of a status table forming area on S-RAM, an initial value ("FF" in the example shown in the drawing) is set (written) when there is no defective. When a defective is detected, a status value indicative of such content ("0F" in the example shown in the drawing) is written. In this manner, the block status table 32 is prepared.

Subsequently, for example, as shown in FIG. 12, the controller tentatively numbers the flash memory 5 corresponding to the logical block addresses. In this case, based on the information of the status table 32, defective blocks are excluded from objects to be numbered. The numbered numeric value (a lower stage in the example of the drawing) and the status value (an upper stage in the example of the drawing) are written in the redundant portion 52 of the flash memory.

In the flash memory system of the state, the correlation of the logical block address and the physical block address is not established, and no queue exists. However, the defective block is a part of the surplus area.

[Initial Setting During Resetting]

During turning-on of a power supply, or during resetting, the controller grasps the size (the number of chips) of the flash memory, and obtains the total number Nmax of the minimum erasing units or blocks.

Subsequently, the controller reads the redundant portion of each block (physical block) in the flash memory 5. In this case, the redundant portion exists in each minimum storage unit (1 byte+redundant portion) in the block, but the same data is written in all redundant portions of the same block. Therefore, the redundant portion in one minimum storage unit per block may only be read. Additionally, by reading and collating a plurality of redundant portions (contents are usually the same), the reliability of the minimum storage unit or block can also be evaluated.

In the above example, the read data are as follows:

| Physical Block Address | Status Value | Logical Block Address Value |
|---|---|---|
| #0000 | FF | 0000 |
| #0001 | FF | 0001 |
| #0002 | FF | 0002 |
| #0003 | 0F | — |
| #0004 | FF | 0003 |
| #0005 | FF | 0004 |

From the obtained data, the address conversion table 31 and the block status table 32 are formed in the address conversion table forming area and the status table forming area on S-RAM (because during turning-on of the power supply, or during resetting the data on S-RAM is extinguished, or loses reliability). Thereafter, until the resetting is performed again, the address conversion table on S-RAM may merely be accessed, and the redundant portion of the flash memory does not need to be read. In this case, for the address conversion table 31 and the block status table 32, for example, the top address of the specific area on S-RAM is used as a reference point (regarded as "0000", or the like). From this reference point, in the address conversion table, necessary data (physical block address values) are written in positions of the corresponding logical block address values, while in the block status table, necessary data (status values) are written in positions of the corresponding physical block address values.

Moreover, in this case, when a block is found in which the logical block address is "FFFF", i.e., has an erased pattern, the block is regarded as the queue element, and registered in the queue table 50. Moreover, it is checked whether or not all the data in the elements of the queue are "FFFF", i.e., have erased patterns.

In this case, in the actual queue table 50, the address conversion table 31 and the block status table 32, for example, the top address of the specific area on S-RAM is used as the reference point (regarded as "0000", or the like), and from the reference point, in positions of corresponding queue numbers, the logical block address values, or the physical block address values, the necessary data (the physical block address values, the physical block address values, and the status values) may be written, respectively.

[Operation During Reading]

Figure 13:
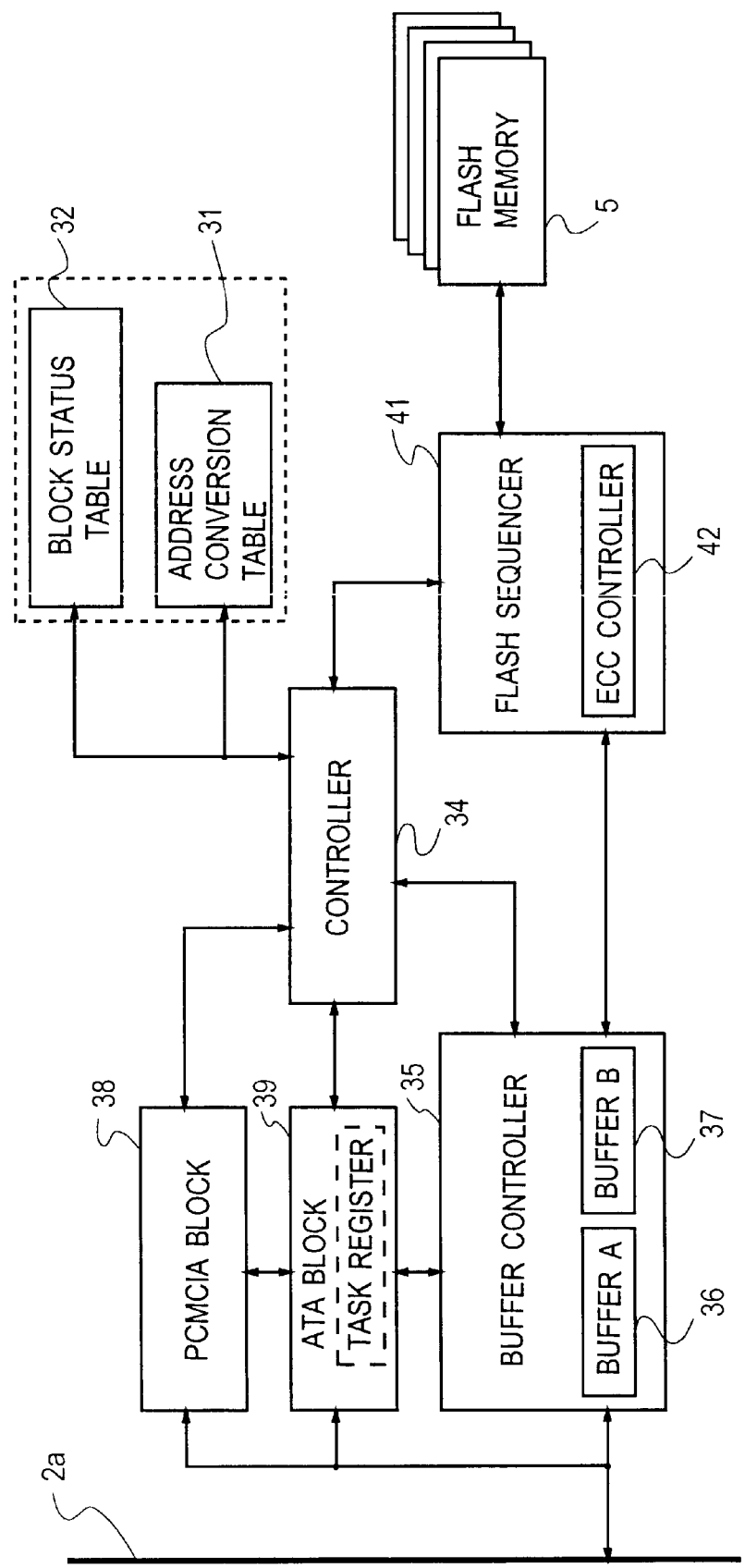
FIG. 13 is a block diagram showing an example in which the flash memory system is applied to a memory card.

As an example of an operation during reading, an operation in a device shown in FIG. 13 will be described. FIG. 13 is a block diagram showing one embodiment of the flash memory system. The flash memory system of the example shown in the drawing comprises a PC card bus 2a connected to a host computer 1, and a buffer A36 and a buffer B37 in a buffer controller 35 connected to the PC card bus 2a (in the example the components are integrally shown, but may separately be disposed). Moreover, the PC card bus 2a is connected to a PCMCIA block 38 and an ATA block 39. The buffers A36 and B37 in the buffer controller 35 are connected to a flash sequencer 41 and an ECC controller 42 as the flash memory interface 4 (in the example, these components are integrally shown, but may separately be disposed), and the flash sequencer 41, and the like are connected to a memory array of the flash memory 5.

Moreover the buffer controller 35, PCMCIA block 38, ATA block 39, and flash sequencer 41 are connected to a controller 34 which comprehensively controls these components. The controller 34 is connected to its directly accessible ROM and RAM, in which control algorithm, data necessary for arithmetic operation, and the like are stored. Moreover, the address conversion table 31 and the block status table 32 are usually formed on the RAM.

The PC card bus 2a is a bus system for connecting a card-shaped expansion system referred to as the PC card (e.g., SCSI interface unit, MODEM unit, memory card, and the like), and can in the example connect the PC card via a predetermined card slot of the PCMCIA standards. The PC card is particularly preferably used in a laptop computer or another portable apparatus, a system which transmits/receives information with the apparatus, and the like.

The buffer controller 35 and the buffers A36, B37 have the same constitutions as in the data relay means 3a, and the description thereof is omitted.

The PCMCIA block 38 functions as a PC card bus interface for appropriately connecting to the PC card bus 2a. Specifically, data necessary for a control system (not shown) of the PC card bus 2a to recognize that the PC card is connected, a procedure necessary for the recognition, and the like are stored, so that a necessary operation can automatically be performed.

A task register of the ATA block 39 accommodates data of a cylinder, a head, and a sector supplied from the host computer or CHS addresses, conversely supplies the data to the side of the host computer, and is provided with data for conversion to the logical address on the side of the host computer. Thereby, the host computer 1 can treat the flash memory system as if it were a hard disc.

In the example, the flash memory 5 constitutes a memory array in which a plurality of memory elements are assembled, so that a necessary storage capacity can be secured. The other constitution is the same as the above-described constitution example, the same constituting elements are denoted with the same reference numerals, and the description thereof is omitted.

As described above, the flash memory system of the example shown in the drawing is accommodated in the PC card, and can be treated in the same manner as the hard disc of the SCSI specifications. By disconnectably connecting the system as the PC card to the host computer, a relatively large volume of data can freely be moved, or stored with a small, light card. Additionally, since the system can be treated in the same manner as the hard disc able to be recognized by the conventional software, the existing software can be used, and handling is also facilitated.

As the operation during reading, first the controller 34 receives address data from the host computer 1 via the buffer A36 (or B37), and the like. In this case, if the address data sent from the host computer is of LBA system, by performing the same operation using the equation (I) as described above, the conversion to the logical block address and the offset value is performed.

Specifically, when the logical address sent from the host computer is LBAs, logical block address LBA is obtained as follows:

$$LBA=LBAs/k$$

k=the number of sectors in the minimum erasing unit (8 or 16)
Remainder m is an offset value which indicates a position of the sector in the block.

Moreover, when the data sent from the host computer is of CHS system, by the following calculation equation (II), the data is converted to data of LBA system. Additionally, the converting function, like AT block, and the like, may independently be provided as a block which has an exclusive function of converting CHS system data to LBA system data.

$$LBA=(C \times HpC+H) \times SpH+S-1 \qquad (II)$$

Here, C: cylinder number, H: head number, S: sector number, HpC: head/cylinder, SpH: sector/head.

The obtained logical block address is converted to the physical block address by the data conversion table 31, and the offset value is added to form the physical address data.

In the reading operation, usually, the reading from the flash memory 5 and the transfer to the host computer 1 are automatically performed. Specifically when the controller 34 sets an address of a memory area to be read, the flash memory interface 4, e.g., the flash sequencer 41 automatically reads data from the memory area. The buffer controller 35 successively transmits the transferred data in accordance with the transfer speeds on the sides of the flash memory 5 and the host computer 1.

In response to an instruction of data transfer from the controller 34, the ATA block 39 releases a busy state, and notifies the host computer 1 of data transfer start. In this manner, after the address converting operation is performed, the controller 34 performs a predetermined setting operation to release from the operation for the data transfer, so that the next address converting operation can be performed ahead. Moreover, since the data converting operation can be processed at a high speed as described above, the operation is usually completed during the data transfer. Therefore, the data transfer speed is remarkably enhanced.

[Operation During Writing]

For an operation during writing, the operation before the address conversion is the same as in the above-described operation during reading. Subsequently, the address conversion is performed, and the operation of writing to a predetermined address on the flash memory 5 is performed.

The flash memory 5 cannot be written over as described above Therefore, the writing operation is accompanied by an operation of erasing the block unit. In this case, data in a block to be written is once read then erased, and new data may be written/added. In the method, however, since the reading operation is accompanied before writing, access speed is decelerated.

To solve the problem, the surplus area which is not included in the logical address area in the physical address area may be used. Specifically, new data is once written into an arbitrary block in the surplus area. Subsequently, the block address which has an original address to be written is set as an address to be erased. Moreover, the block address having an address to be written on the block status table 32 is rewritten to the address of the block in the surplus area into which the new data is written. Thereby, the block in the surplus area is set as a new block address which has the written data.

In this case, the queue in the surplus area is preferably used. Specifically, an element is taken out of the top of the queue, and new data is once written into a predetermined position (designated by offset) in the block, to form a block to be exchanged. Subsequently, the logical block address of the block as the original writing destination is set as an address to be erased.

Moreover, in the redundant portion of the block to be exchanged, the block address and status value of the block to be erased are written. In this case, the logical block of the address conversion table may also be rewritten. Thereby, the block taken from the queue becomes a new logical block address which has the written data.

Subsequently, at the time preferably all, or a predetermined amount of data transfers are completed, residual data of the block to be erased (data not subjected to rewriting) is transferred into the block to be exchanged, and the block to be erased is erased. Thereby, the reading operation and the erasing operation accompanying the writing are performed after all the data are transferred, and apparently, by completing earlier the reception of the written data for the computer on the side of the host computer, the operation speed during writing is enhanced. Additionally, the operation before all the data are rewritten is held in a history holding table, and the like, and the writing operation using the queue is smoothly performed.

Additionally, in the above example, during writing, the surplus area on the flash memory, and the storage medium in the data relay means, e.g., the queue developed on RAM are used. Additionally, in RAM, and the like, there is a possibility that data is lost by momentary cutting-off of a power supply. Moreover, in the queue, a large amount of data are written, a plurality of operations are overlapped, and a situation arises where a plurality of the blocks to be erased and the blocks to be exchanged are present. Therefore, after the rewriting of each block is completed, it is preferable to simultaneously rewrite the block status value and the data for exchanging the addresses on the redundant area of the flash memory.

As described above, since there are provided the queue corresponding to the minimum erasing unit, the address conversion table 31, and the block status table 32, and the flash memory 5 is managed by these, the reading/writing operation can extremely efficiently be performed, and the entire processing speed is remarkably enhanced. Moreover, the defective sections of the flash memory 5 and the ECC are appropriately managed by the block status table 32, and the defective block can be replaced by the queue, so that the data can be held stably over a long period.

POSSIBILITY OF INDUSTRIAL UTILIZATION

The flash memory system of the present invention is not limited to the above-described constitution example, and can variously be applied. Moreover, for the application range, the present invention can be applied not only to a laptop computer or another computer system but also to a portable communication apparatus, a digital camera and another multimedia system, and other fields in which various data are handled.

EFFECT OF THE INVENTION

As described above, according to the present invention, a flash memory system can be realized which has little delay in a writing/reading time, can remarkably easily perform a writing operation, can realize a high-speed operation, and which can adequately manage defective sectors, and the like.

What is claimed is:

1. A flash memory system comprising:
   a memory manager for managing data transmission/reception between a host computer and a flash memory,
   said memory manager having an address conversion table for converting a logical address given to the flash memory from the host computer and a physical address as an actual address of the flash memory, said address conversion table being defined in accordance with minimum erasing units corresponding to blocks,
   said memory manager comprising a block status table storing data indicating a state of each block of said flash memory corresponding to a minimum erasing unit of the flash memory, said data indicating at least whether or not each block is good, has a bad sector, or is being used,
   said memory manager setting a size of an area of a logical address in which the flash memory is accessible from said host computer to be smaller than a size of an area of a physical address as an actual address of the flash memory, and
   said memory manager having a queue ready for use in a surplus area of the physical address area which is made up of blocks in an erased state not corresponding to the blocks in the logical address area and managing the queue, the physical address, and the physical address per block minimum erasing unit.

2. The flash memory system according to claim 1 comprising said memory manager, a bus interface connectable to the host computer, and a flash memory interface for performing a writing/reading to the flash memory,
   said memory manager having data relay means for relaying data transmitted to a side of the flash memory from a side of the host computer and data transmitted to the side of the host computer from the side of the flash memory.

3. The flash memory system according to claim 1 wherein:
   said address conversion table functions so that a logical block address obtained by dividing, into said minimum erasing units, the logical address used when the host computer designates a minimum storage unit on a storage medium may correspond to a physical block address obtained by dividing said physical address into said minimum erasing units.

4. The flash memory system according to claim 1, wherein the conversion of said logical address and said physical address is performed before the writing/reading of data to the flash memory is started.

5. The flash memory system according to claim 1, wherein a size of a physical address area of said flash memory is larger than a size of a logical address area.

6. The flash memory system according to claim 1, wherein when a trouble occurs in an arbitrary minimum erasing unit corresponding to said logical address area, the minimum erasing unit is replaced with any one of the minimum erasing units of a portion of the physical address area which does not correspond to the logical address area.

7. The flash memory system according to claim 1, wherein said address conversion table is formed on RAM by data read from a redundant portion of the flash memory after resetting.

8. The flash memory system according to claim 7 wherein said block status table is formed on the RAM by the data read from the redundant portion of the flash memory after the resetting.

9. The flash memory system according to claim 1, wherein when a trouble occurs in an arbitrary block in the physical address area, said memory manager replaces the arbitrary block with trouble with an arbitrary block in said queue.

10. The flash memory system according to claim 1, wherein when data is written to the flash memory, said memory manager writes a logical block address of the data in the flash memory to a predetermined block in the queue.

11. The flash memory system according to claim 10 wherein:
    in a case where the logical block address has data other than data to be updated,
    after the transfer of a predetermined amount of data from the host computer is completed,
    said memory manager transfers the existing data from an estimated writing destination block to the predetermined block in the queue in which the new data is written.

12. The flash memory system according to claim 1, wherein:
    said memory manager functions so that the physical address area and the logical address area may correspond to the logical block address and a physical block address divided into the minimum erasing unit, and
    said memory manager sets a start position of the physical address area and logical address area as arbitrary positions determined every predetermined number of times of resets.

13. The flash memory system according to claim 1, wherein:
    said memory manager writes data of an arbitrary block in the physical address area to a block of the queue every predetermined number of times of resets,
    said physical address area corresponds to the logical address area,
    said memory manager is arranged to subsequently set an address of the block of the queue, in which the data is written, as the logical block address of the arbitrary block in the physical address area, and
    said memory manager is arranged to subsequently set the arbitrary block in said physical address area as part of the queue.

14. The flash memory system according to claim 1, comprising, in addition to said memory manager, a bus interface for connecting to the host computer and a flash memory interface for performing a reading/writing operation to the flash memory.

15. The flash memory system according to claim 1, wherein said queue is controlled by a pointer.

16. The flash memory system according to claim 1, wherein said minimum erasing unit corresponds to 8 or 16 minimum storage units.

17. The flash memory system according to claim 1, wherein a minimum storage unit has a size obtained by adding a data length of redundancy to a data length of one sector.

18. The flash memory system according to claim 17, wherein a redundant portion of said minimum storage unit has data indicating at least whether or not the block to which the minimum storage unit belongs is good, whether or not a bad sector is present and whether or not the block is used.

19. The flash memory system according to claim 18 wherein said data is stored in one block of said redundant portion.

20. The flash memory system according to claim 2 wherein said data relay means has two buffers for temporarily storing a predetermined length of data, and said data relay means alternately stores data transmitted from the side of the host computer or from the side of the flash memory in the two buffers, and alternately transmits data from the buffer filled with data to the side of the flash memory or to the side of the host computer.

21. The flash memory system according to claim 1, which is an IC chip.

22. The flash memory system according to claim 1, which is a card-shaped external storage system.

* * * * *